(12) United States Patent
Brennan

(10) Patent No.: US 6,955,928 B1
(45) Date of Patent: Oct. 18, 2005

(54) CLOSED LOOP RESIDUAL GAS ANALYZER PROCESS CONTROL TECHNIQUE

(75) Inventor: William S. Brennan, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 586 days.

(21) Appl. No.: 09/883,883

(22) Filed: Jun. 18, 2001

(51) Int. Cl.[7] ............................................. H01L 21/00
(52) U.S. Cl. ...................................................... 438/14
(58) Field of Search ........................................ 438/14

(56) References Cited

U.S. PATENT DOCUMENTS

| | | | |
|---|---|---|---|
| 5,865,900 A * | 2/1999 | Lee et al. ................. | 134/1.2 |
| 2002/0006677 A1 * | 1/2002 | Egermeier et al. ......... | 438/14 |

* cited by examiner

*Primary Examiner*—W. David Coleman
(74) *Attorney, Agent, or Firm*—Williams, Morgan & Amerson, P.C.

(57) ABSTRACT

A technique for use in fabricating an integrated circuit are disclosed. The method generally begins by performing an operation on a wafer using a fabrication tool. Next, volatiles are desorbed from the wafer. The desorbed volatiles are sampled and raw spectral data indicating the content of the desorbed volatiles is generated. The raw spectral data is subjected to a spectroscopic analysis. An operational parameter of the fabrication tool is then modified responsive to the result of the results of the spectroscopic analysis. In one particular aspect of the invention, a controller receives the raw spectral data and processes the raw spectral data to determine the presence of a residual material on the wafer. The controller then controls the process flow operation to reduce the amount of the residual material on the wafer responsive to the results of processing the raw spectral data. Other aspects of the invention include the apparatus implementing the process flow and the controller itself.

9 Claims, 4 Drawing Sheets

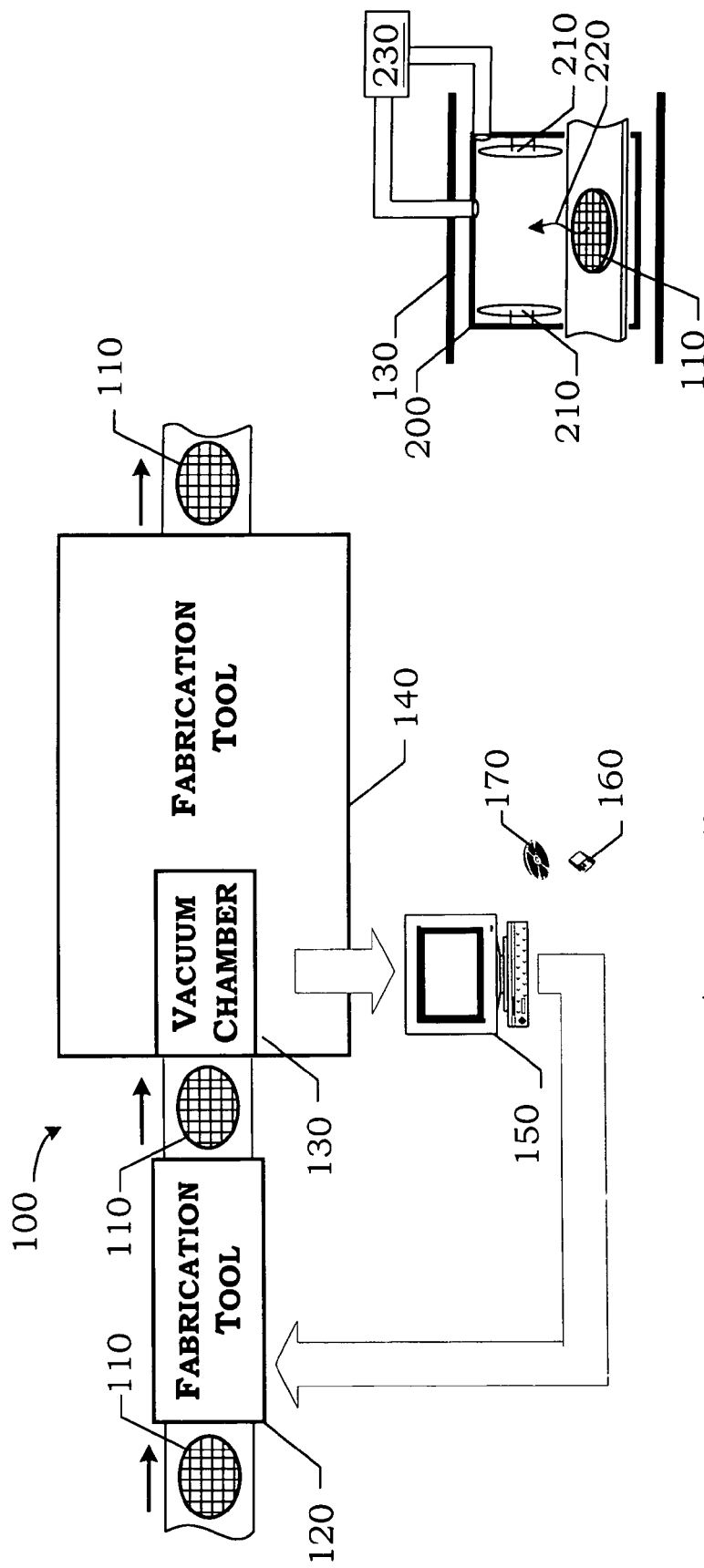

CLOSED LOOP RESIDUAL GAS ANALYZER PROCESS CONTROL TECHNIQUE

BACKGROUND OF THE INVENTION

1. Field of the Invention

The present invention relates to a method for controlling the presence and amount of residual material on a wafer prior to metal deposition in a semiconductor fabrication process and, more particularly, to a closed loop technique employing a residual gas analyzer for accomplishing the same.

2. Description of the Related Art

Integrated circuits are manufactured from wafers of a semiconducting substrate material. Layers of materials are added, removed, and/or treated during fabrication to create the integrated, electrical circuits that make up the device. Virtually any fabrication process essentially comprises the following four basic operations:

- layering, or adding thin layers of various materials to a wafer from which a semiconductor is produced;
- patterning/etching, or removing selected portions of the added layers;
- doping, or placing specific amounts of dopants in selected portions of the wafer through openings in the added layers; and
- heat treating, or heating and cooling the materials to produce desired effects in the processed wafer.

Although there are only four basic operations, they can be combined in hundreds of different ways, depending upon the particular fabrication process. See, e.g., Peter Van Zant, *Microchip Fabrication A Practical Guide to Semiconductor Processing* (3d Ed. 1997 McGraw-Hill Companies, Inc.) (ISBN 0-07-067250-4).

One important quality control consideration includes ensuring separation of operations. Most operations in a process flow involve some form of selective chemistry and/or physical operation that materially changes the wafers under fabrication. One operation may be used in the flow with another operation whose selective chemistry or physical operation are fundamentally incompatible. In other words, the materials used or the physical operations employed in the first operation may interfere with, diminish, or destroy the efficacy of the second operation. If this effect is of sufficient magnitude, a defective device, a defective wafer, or even a batch of defective wafers may result.

For example, consider a process flow that includes a common layering operation, known as "physical vapor deposition" ("PVD"), followed by a what is commonly known as a chemical mechanical polishing, or a "CMP" operation. In CMP operations, a previously deposited material is polished from the surface of a wafer to planarize the wafer for subsequent procession steps. More particularly, the wafer is turned upside down on a polishing pad, a slurry is introduced between the wafer and the polishing pad, and the wafer is rotated against the polishing pad until the deposited material is sufficiently polished away. A general discussion of CMP may be found in van Zant, supra, at 300–302. A PVD operation sputters a layer of a metal onto a wafer. A general discussion explaining the sputtering principles of PVD operations may also be found in van Zant, supra, at pp. 404–409.

If after the CMP operation there is any residual deposited material or any residual slurry or chemical on the wafer, this residual material may interfere with the sputtering process in the PVD system. This interference may result in an inadequate or incomplete layering of the metal that might render the completed device defective. This interference may also lead to a host of process control problems. Exemplary of these process control problems are excessive process, defect and maintenance control variabilities, and inconclusive causation analysis as to what the problem is. Thus, it is desirable that CMP operations be performed such that, after the operations are completed, the amount of residual material, i.e., the slurry, be reduced or eliminated.

Current process flows monitor various aspects of PVD operations to improve their efficacy or to find errors causing defective wafers. One aspect that is monitored is separation from the preceding operation. For example, if the preceding operation is a CMP operation, the process flow will examine the incoming wafers to determine whether there is any residual material, slurry, or chemicals on the wafer. Unfortunately, current integration process technology cannot measure residual material, slurry, or chemicals on wafers incoming to a PVD process.

Instead, this type of monitoring is typically uncontrolled or is controlled through a typical PVD metal sequence consisting of a degas, sputter etch, metal deposition, and quench. During these individual processes the wafers are heated using either internal pedestal temperature methods or from process conditioning which translates into increased energy on the wafer. This wafer temperature causes the residual slurry and/or chemicals to desorb from the wafers as volatiles vapors. These vapors may condense on process chamber walls or other system parts and "contaminate" the chamber or the complete system, thereby affecting further wafer processing quality.

To monitor these desorbed volatile vapors, "residual gas analyzers" ("RGAs") have been inserted into the process chambers where manual monitoring of the vapors can occur within the vacuum chamber. The RGA performs a spectroscopic analysis of the desorbed volatiles. Unfortunately, RGAs typically provide raw spectral data that requires a highly trained person to interpret and use the data. Furthermore, there is no way to automatically incorporate this knowledge back into the process. The individual must instead personally communicate this information to and negotiate with the owner of the equipment performing the previous process to implement appropriate corrective action. Since this owner is not responsible for the performance of the RGA nor, frequently, the PVD, these negotiations seldomly result in any kind of agreement satisfactory to both sides.

The present invention is directed to resolving one or all of the problems mentioned above.

SUMMARY OF THE INVENTION

A technique for use in fabricating an integrated circuit are disclosed. The method generally begins by performing an operation on a wafer using a fabrication tool. Next, volatiles are desorbed from the wafer. The desorbed volatiles are sampled and raw spectral data indicating the content of the desorbed volatiles is generated. The raw spectral data is subjected to a spectroscopic analysis. An operational parameter of the fabrication tool is then modified responsive to the result of the results of the spectroscopic analysis. In one particular aspect of the invention, a controller receives the raw spectral data and processes the raw spectral data to determine the presence of a residual material on the wafer. The controller then controls the process flow operation to reduce the amount of the residual material on the wafer responsive to the results of processing the raw spectral data.

Other aspects of the invention include the apparatus implementing the process flow and the controller itself.

BRIEF DESCRIPTION OF THE DRAWINGS

The invention may be understood by reference to the following description taken in conjunction with the accompanying drawings, in which like reference numerals identify like elements, and in which:

FIG. 1 depicts particular process flow operated in accordance with the present invention;

FIG. 2 conceptually illustrates the desorption of residual materials off a heated wafer in a vacuum chamber of a fabrication tool in the process flow of FIG. 1;

Figure 3:
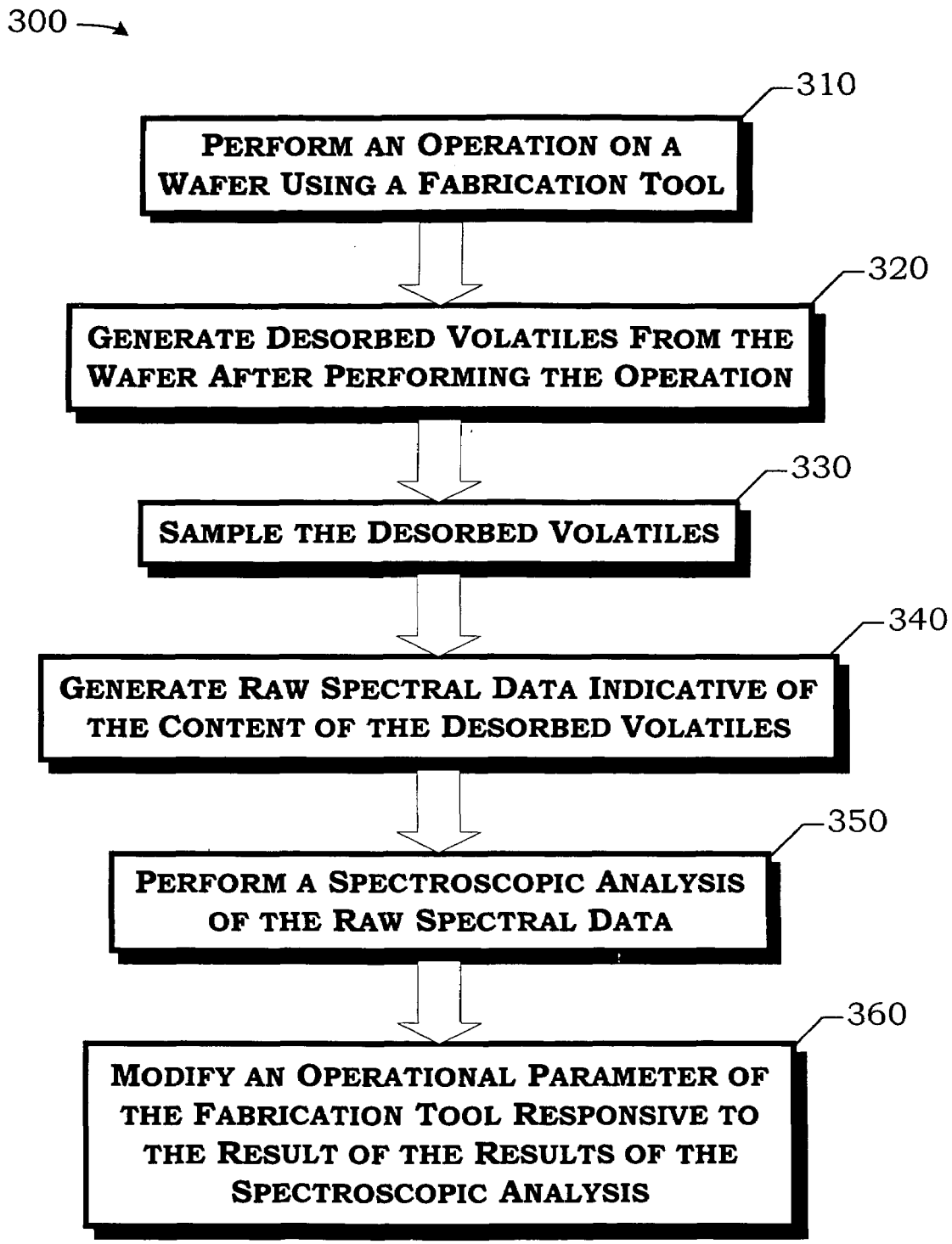
FIG. 3 illustrates one particular implementation of a method for controlling the process flow of FIG. 1 performed in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Turning now to the drawings, FIG. 1 illustrates one particular process flow 100 in accordance with the present invention. The process flow will typically comprise a portion of a much larger process flow for the fabrication of integrated circuits. FIG. 1 depicts operations only on a single wafer 110, but it will be appreciated by those in the art that the various operations in a process flow, e.g., the process flow 100, are usually performed on numerous wafers 110 organized into "wafer lots" or "batches." Thus, the present invention may be performed on a wafer-by-wafer basis or on a lot-by-lot basis.

In the process flow 100, a first fabrication tool 120 first performs some predetermined operation on a wafer 110. The nature of the operation will depend on the type of the fabrication tool 120. For instance, the fabrication tool 120 might perform a chemical-mechanical polishing operation that might leave slurry or chemicals on the wafer 110. Alternatively, the fabrication tool 120 might be used to conduct some type of patterning, such as etching, that might leave residual photoresist or polymers on the wafer 110. This aspect of the invention will be implementation specific, and the fabrication tool 120 may be any suitable fabrication tool known to the art.

The wafer 110 is then forwarded to a second fabrication tool 140 that includes a vacuum chamber 130. The fabrication tool 140 may be virtually any vacuum cluster tool known to the art, or even any fabrication tool known to the art so long as it is equipped with a vacuum chamber. In one particular embodiment, the metal deposition tool is an Endura Advanced Liner™ commercially available from:

Applied Materials, Inc.
3050 Bowers Avenue
Santa Clara, Calif. 95054
ph: (408) 727-5555
http://www.appliedmaterials.com In this particular embodiment, then, the wafer 110 is processed using a PVD technique as is known in the art. However, other embodiments may employ other makes, models, and types of fabrication tools.

Turning now to FIG. 2, the wafer 110 is loaded into the vacuum chamber 130, which has been modified by the addition of a residual gas analyzer ("RGA") 230. The RGA 230 performs a spectroscopic analysis of vapors desorbed from the wafer 110 to obtain data indicating whether there is any residual slurry or photoresist (not shown) on the wafer 110 from the operation of the fabrication tool 120. More particularly, the wafer 110 is loaded into a heated vacuum chamber 200 attached to the RGA 230. In one particular embodiment, the heated vacuum chamber 200 is a lamp degas chamber, but any chamber capable of heating and desorbing volatiles upon the application of physical energy may be used. One exemplary alternative is a pedestal temperature controlled process chamber. The heating elements 210 heat the chamber 200, and hence the wafer 110, in a vacuum until any residual material desorbs from the wafer 110. Gaseous volatiles, e.g., water or hydrocarbons, are emitted during the desorption, as symbolized by the arrow 220. A sensor head of the RGA 230 detects these volatiles and outputs raw spectral data indicating the content and quantity of the volatiles.

In one particular embodiment, the RGA 230 is implemented with a well known, commercially available RGA sold under the name HPQ2 by:

Spectra International LLC
380 Woodview Avenue
Morgan Hill, Calif. 95037
ph: 408.778.6060
fax: 408.776.8575
http://www.spectra-sensors.com/

Operating information for the HPQ2 is readily available from Spectra International. Operating characteristics for this RGA are set forth in Tables 1, 2, and 3 below.

TABLE 1

General Specification for the HPQ2 RGA

| | |
|---|---|
| MASS RANGE: | 2–80 amu |
| DETECTOR: | Faraday cup |
| MAXIMUM RECOMMENDED OPERATING PRESSURE: | HPQ 2-1 millitorr (1.3E−3 mbar) |
| | HPQ 2S - 8 millitorr (1E−2 mbar) |
| MAXIMUM PERMISSIBLE OPERATING PRESSURE: | HPQ 2S will withstand 40 millitorr transient pressure bursts |

TABLE 1-continued

General Specification for the HPQ2 RGA

| | |
|---|---|
| MINIMUM DETECTABLE PARTIAL PRESSURE: | 8E−11 torr (1E−10 mbar) |
| MINIMUM DETECTABLE CONCENTRATION: | <1 Oppm at 4E−3 torr (5E−3 mbar) |
| MASS STABILITY: | Better than +/− 0.1 emu over 8 hours under constant conditions |
| RESOLUTION: | 1 emu at 10% peak height |

TABLE 2

Analyzer and Housing Data for the HPQ2 RGA

| | |
|---|---|
| BAKEOUT TEMPERATURE: | 250° C., electronics removed |
| MOUNTING FLANGE: | DN38CF (70 mm /2.75 inch OD) Conflat flange |
| INSERTION LENGTH ION SOURCE SENSITIVITY: | 25 mm (1.0 inch) |
| ION SOURCE SENSITIVITY: | 5E−5 A/torr |
| ELECTRON ENERGY: | 40 and 70 eV (adjustable from PC) |
| EMISSION CURRENT: | 0.1 and 0.7 mA (adjustable from PC) |
| FILAMENTS: | Twin tungsten (optional ThO/Ir or Y O/Ir) |

TABLE 3

Controller Information for the HPQ2 RGA

| | |
|---|---|
| ELECTRONICS MODULE WEIGHT: | 2.3 Kg |
| DIMENSIONS: | 127 mm × 127 mm × 182 mm |
| OVERALL LENGTH: | 229 mm |
| MAXIMUM AMBIENT OPERATING TEMPERATURE | 35° C., 80% RH (non condensing) |
| SOFTWARE: | Process Eye V1.6, or RGA for Windows V2.4 |
| POWER: | 24 VDC, 3A. External supply included |
| COMMUNICATION | |
| BUS: | RS232C, (9600 baud, 15 m (50 ft)) |
| BETWEEN PC & HPQ-2: (Baud rate & max. distance) | RS422/*RS485, (115000 baud, 1.2 Km (4000 ft)) |
| *SECS 11 INTERFACE: | *Relevant to Process Eye only Optional, SECS-I or HSMS-SS |
| MAXIMUM RGA HEADS: | 30 heads |
| PC REQUIREMENTS | |
| 1 or 2 HEADS | Pentium 90 Mhz, 16 MB of RAM* *Requires 1 RS-232/422 port head, or 1 RS485 port/16 heads |
| 3 to 9 HEADS | Pentium 120 Mhz, 24 MB of RAM* *Requires 1 RS-232/422 port head, or 1 RS485 port/16 heads |
| 10 to 30 HEADS | Pentium 200 Mhz, 32 to 64 MB of RAM* *Requires 1 RS-232/422 port head, or 1 RS485 port/16 heads |

In this particular embodiment, the heated vacuum chamber 200 heats the wafer 110 at a temperature ranging from approximately 200° C. to approximately 500° C., and at a pressure of approximately $10^{-7}$ torr to approximately $10^{-3}$ torr for approximately 10–120 seconds. According to an alternative embodiment, a PVD/CVD process heats at a temperature ranging from approximately 100° C. to 500° C. at a pressure of 1.5 to 60 millitorr for approximately 10 to 120 seconds. As will be appreciated by those in the art having the benefit of this disclosure, vacuum chambers, e.g., vacuum chamber 130, do not operate at all times at an absolute vacuum. Hence, the desorption occurs at some small, nominal pressure generally referred to in the art as a "vacuum."

Note that, although RGAs are known in the art, their use in this manner is unknown. The vacuum chamber 130 must therefore be modified by the installation of the RGA 230. The RGA 230 thus becomes what is known in the art as an "add-on" sensor. An "add-on" sensor is any sensor with which a fabrication tool is equipped that is not supplied by the fabrication tool's vendor. Techniques for installing and interfacing add-on sensors are known to the art and any such suitable technique may be employed here.

Returning to FIG. 1, the raw spectral data from the RGA 230 is forwarded to a computer system 150, symbolically represented by a single workstation. The computer system 150 may be this simple in some embodiments, but the invention is not so limited. Typically, the computer system 150 will be a full fledged system of networked computers as the process flow depicted in FIG. 1 will typically be part of a much larger process flow. The invention admits wide variation in equipment, communications protocols, certain applications software, and transmission media, as will become apparent from the following discussion, in its implementation. Indeed, the invention is not limited by these factors. Each of these factors will be implementation specific. The particular embodiments of the computer system 150 discussed below are exemplary only.

The computer system 150, again as noted above, will typically comprise a plurality of networked computers (not shown in FIG. 1) communicating with a network server (not shown in FIG. 1) over a plurality of corresponding communications links (also not shown in FIG. 1). The computer system 150 may be a local area network ("LAN"), or a wide area network ("WAN"), or some combination of the two. The computer system 150 may even comprise, in some embodiments, a part of the Internet. If networked or a part of the Internet, the computer system may be implemented in any suitable architecture known to the art, e.g., a client/server architecture or a peer-to-peer architecture. Note also that, in client/server architectures, more than one server might be employed. Also, the computer system 150 may be implemented in any topology known to the art as suitable for a given architecture and application. The computer system 150 may also utilize any suitable communications protocol, e.g., an Ethernet or a token-ring network protocol. The communications links may be implemented using any suitable transmission media known to the art, including without limitation optical fibers, co-axial cables, and twisted wire pairs. In some embodiments, the communications links 130 might even be wireless links. Although the computer system 150 is symbolically represented by a workstation, the invention is not so limited. The computer(s) might be some other type of computer, for instance, a desktop computer, a laptop computer, or a handheld computer.

Much of the invention is, accordingly, software implemented. Thus, in some aspects, the invention may comprise a program storage medium encoded with the software capable of implementing the method and/or a computer programmed to implement the method. The program storage medium may be magnetic, such as the floppy disk 160 in FIG. 1, or optical, such as the compact disk, read only memory ("CDROM") 170, also in FIG. 1, or some other type of medium capable of storing the computer instructions.

Some portions of the detailed descriptions herein are consequently presented in terms of a software implemented process involving symbolic representations of operations on data bits within a computer memory. These descriptions and representations are the means used by those in the art to most effectively convey the substance of their work to others skilled in the art. The process and operation require physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantifies. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

Returning again to FIG. 1, the computer system 150 receives the raw spectral data from the RGA 230. The raw spectral data will typically be atomic mass unit ("AMU") partial pressures, of approximately 60 AMU collected at time sequences of many/second to many/minute depending on the sampling plan, although the invention is not so limited. The computer system 150 processes the raw spectral data to determine from the spectroscopic analysis the efficacy of the previous operation performed by the fabrication tool 120 with respect to residual materials from that operation. If the analysis shows that too much residual material remains, the operation of the fabrication tool 120 can be adjusted or corrected to eliminate, or at least reduce, the amount of residual material from its operation. Thus, the computer system 150 also possesses the capability to adjust the operational parameters of the fabrication tool 120. The results of the spectroscopic analysis performed by the computer system 150 may also be stored. In some embodiments, the computer system 150, process fabrication tool 120, or process fabrication tool 140 may generate an alarm or a stop signal halting the process flow 100 before the metal deposition tool 140 operates on the wafer 110 when the spectroscopic analysis results warrant such.

FIG. 3 more particularly describes a method 300 performed in the course of a process flow, e.g., the process flow 100 in FIG. 1, in accordance with the present invention. The method 300 begins by performing an operation on a wafer, e.g., the wafer 110, using a fabrication tool, e.g., the fabrication tool 120, as set forth in the box 310. The type of operation will be implementation specific depending upon the particular fabrication tool employed in any given embodiment. As noted above, in one particular embodiment, the fabrication tool 120 is a CMP tool. The operation in the box 310 in this particular embodiment, therefore, is a chemical-mechanical polishing operation. However, the nature of the operation will vary from embodiment to embodiment. Moreover, the present invention should not be considered limited to the fabrication tool 120 performing CMP operations unless it is specifically set forth in the appended claims.

The method 300 next, as set forth in the box 320, generates desorbed volatiles from the wafer, e.g. the arrow 220 in FIG. 2, after performing the operation in the box 310. As discussed above, in the embodiment of FIG. 1, this is done by heating the wafer 110 under a vacuum in the heated vacuum chamber 200 of the vacuum chamber 130. Note that the vacuum chamber 130 is a part of the second fabrication tool 140, which is not the fabrication tool whose operation is being scrutinized. However, in alternative embodiments, the wafer 110 might be tested in the manner described herein before exiting the first fabrication tool 120 instead of upon entering the second fabrication tool 140.

The method 300 proceeds by sampling the desorbed volatiles as set forth in the box 330, which is followed by generating raw spectral data from the sampled desorbed volatiles, the raw spectral data indicating the content of the desorbed volatiles, as set forth in the box 340. Both of these acts are performed by the RGA 230 in the embodiment of FIGS. 1–2 as was described above.

The raw spectral data is then subjected to a spectroscopic analysis, as set forth in the box 350, whereupon an operational parameter of the fabrication tool 120 is modified based upon the results of this analysis, as set forth in the box 360. Both of these functions are performed by the computer system 150 in the embodiment of FIGS. 1–2. In this respect, the computer system 150 "controls" the operation of the fabrication tool 120 and may be considered its "controller" or, perhaps, a part of the controller for the fabrication tool 120. The parameter to be modified and the manner in which it is modified will be implementation specific. As those in the art having the benefit of this disclosure will appreciate, these factors will depend on the operation performed by the fabrication tool. For instance, if the operation is a CMP, the modification might include increasing rinse or polishing time to help remove additional slurry or material. Alternatively, the parameter might be scheduled maintenance time so that preventive maintenance is performed sooner than it otherwise would be.

Figure 4:
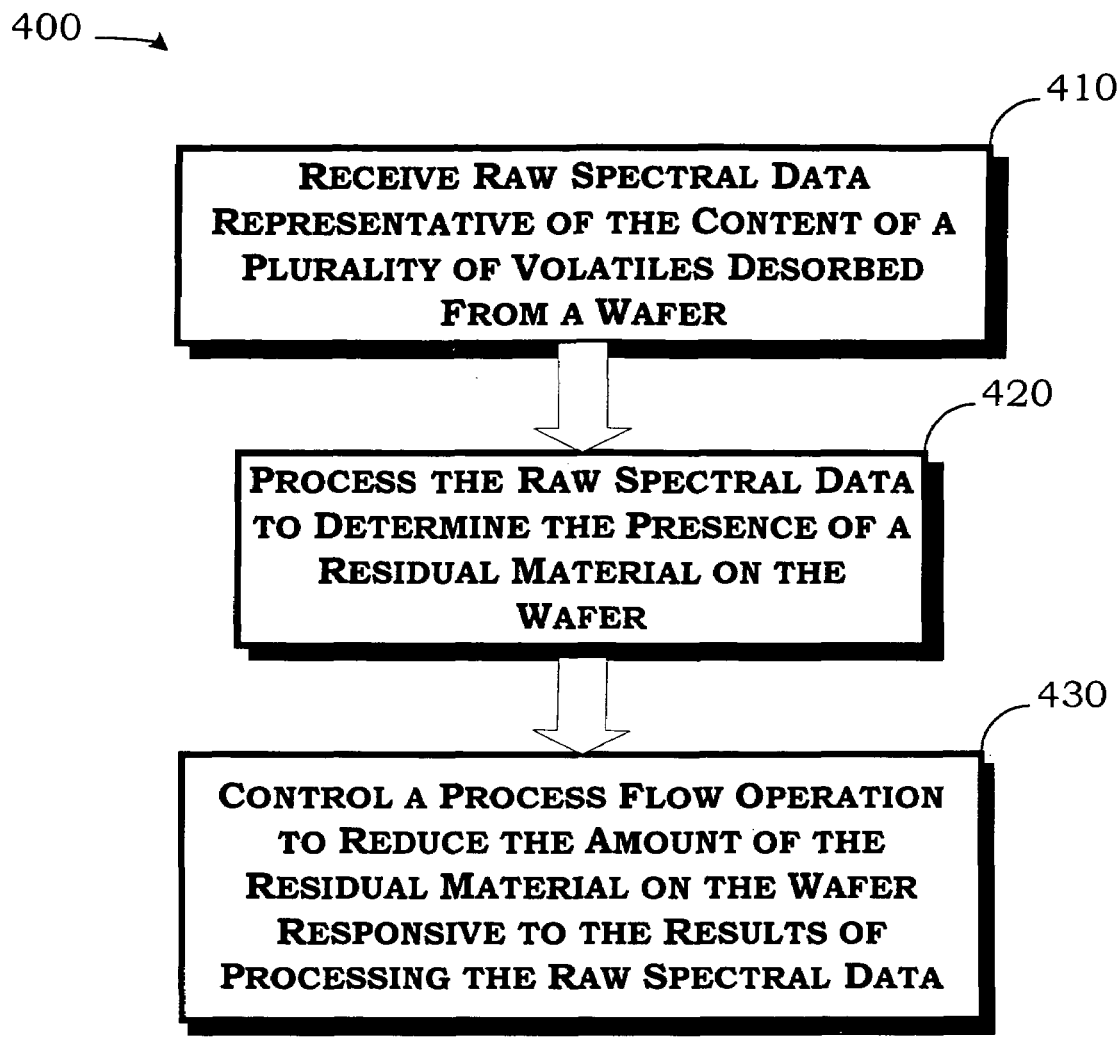
FIG. 4 illustrates a portion of the method in FIG. 3 as performed by a computing device controlling the process flow of FIG. 1.

In one aspect, the invention includes the operation of the computer system 150 in controlling the process flow 100. This operation is more particularly illustrated in FIG. 4. The method 400 of controlling the process flow 100 includes receiving from the RGA 230 the raw spectral data at the computer system 150 as set forth in the box 410. Next, the computer system 150 processes the raw spectral data to determine the presence of residual material on the wafer 110, as set forth in the box 420. Finally, the computer system 150 controls a process flow operation to reduce the amount of the residual material on the wafer 110 responsive to the results of processing the raw spectral data, as set forth in the box 430. Variations of this aspect include a plurality of instructions encoded on a program storage medium, e.g., the disks 160, 170, that, when executed by a computer, perform the method 400, and a computer, e.g., the computing system 150, programmed to perform the method 400.

Figure 5:
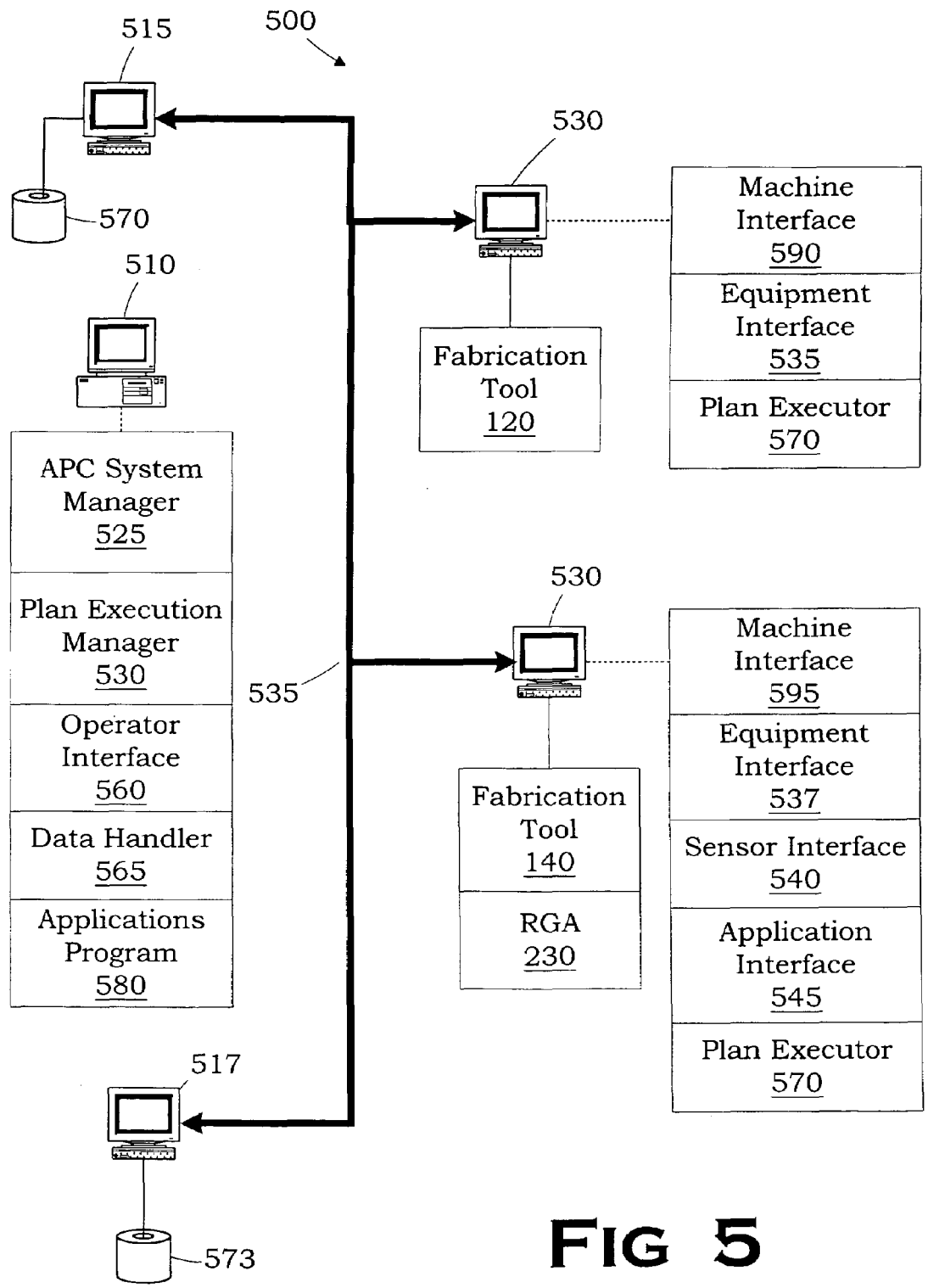
FIG. 5 conceptually depicts one particular implementation of the process flow in FIG. 1 in an Advanced Process Control system.

As noted above, the computing system 150 may take many forms. One particular implementation 500 is illustrated in FIG. 5. Referring now to FIG. 5, a simplified block diagram of an advanced process control ("APC") system 500 is shown. The APC System 500 comprises a distributed software system of interchangeable, standardized software components permitting run-to-run control and fault detection/classification. The software components function to control and operate a process flow such as the process flow 100 in FIG. 1. The process flow in FIG. 5 is but one implementation of the process flow of FIG. 1, and the hardware components bear like numbers to those in FIG. 1.

The software components implement an architectural standard based on the Semiconductor Equipment and Materials International ("SEMI") Computer Integrated Manufacturing ("CIM") Framework compliant system technologies and the Advanced Process Control ("APC") Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. This particular architecture relies heavily on software utilizing object oriented programming and employs the Object Management Group's ("OMG") Common Object Request Broker Architecture ("CORBA") and CORBA_Services specifications for distributed object systems. Information and specifications for the OMG CORBA architecture are also readily, publicly available. An exemplary software system capable of being adapted to perform the functions of the APC system 500 as described herein is the Catalyst system available from KLA-Tencor, Inc.

KLA-Tencor Corporation
160 Rio Robles
San Jose, Calif. 95134
ph: 408.875.3000
http://www.klatencor.com/

However, any suitable software known to the art may be used.

The components communicate with each other using the CORBA Interface Definition Language ("IDL") and rely on a common set of services to support their interaction. A standard set of distributed-object services are defined by the OMG. Among these services are:

CORBA—the standard-based communications protocol used for all direct component-to-component interaction. Standard interfaces can be defined according to an object-oriented, remote invocation communications model. These interfaces and all APC communications are defined using IDL. Components communicate by invoking operations on each others interfaces. Data is passed between components as operation parameters and return values.

OMG Event Service—supports asynchronous communications between components. Many of the APC objects emit events as they change state. These events are received by interested event subscribers. Examples of event usage within the APC system include, but are not limited to, communication component state (including error state), notification of fault alarms detected by fault detection and classification software, and reporting of machine status and collected data.

OMG Trading Service—enables a component to find another component with which to interact. When a component is installed, a description of its services (a services offer) is exported to the Trading Service. Another component can later request a list of service providers that meet certain criteria. The Trading Service supplies a list of other components that can provide the requested service. That capability is used upon component startup to allow one component to find other components with which it must interact. It is also used upon Plan Startup when a Plan Execution component needs to find Capability Providers to provide the required capabilities specified in the plan.

These services are well known in the art. OMG's CORBA/IIOP Specifications document and CORBA Services Specifications documents are widely distributed among those in the art and provide greater detail.

In the illustrated embodiment, the components communicate with each other using CORBA Interface Definition Language ("IDL"). The cooperating software components manage process control plans/strategies; collect data from process equipment, metrology tools, and add-on sensors; invoke various process control applications/algorithms with this information; and update process models and modify/download tool operating recipe parameters as appropriate.

In this exemplary implementation, the APC system 500 includes an APC host computer 510, database servers 515, 517, the fabrication tools 120, 140, and one or more workstations 530. The components of the APC system are interconnected through a bus 535. The bus 535 may actually include multiple layers and use multiple protocols. Overall operation of the APC system 500 is directed by an APC system manager 525 resident on an APC host computer 510. The APC system manager 525 provides administrative, configuration, event, and state services for all servers developed for the APC Framework; definition, grouping, installation, and management of the components in the APC system 500; centralized services for capturing activity and trace information for diagnostic and monitoring purposes; a centralized repository of component configuration information, including setup values, system environment settings; and lists of dependent objects and event channels. However, in alternative embodiments, these functions may be divided into one or more software components, e.g., a base manager, a system manager, a logger, and a registry.

The APC system 500 includes a network of processing modules. These processing modules are sometimes referred to as "integration components." Integration components serve as interfaces to existing factory systems, and provide capabilities for running APC Plans. An "APC Plan" is an application program called to perform some specific task, as is discussed more fully below. The integration components are shown as they might be hosted by the various processing resources within the APC system 500. These specific hosting locations are provided for exemplary purposes only. The processing resources are interconnected, and the various software components may be either distributed among the various computers or centralized, depending on the complexity of the system.

The integration components include, but are not limited to, the APC system manager 525; a plan execution manager 530; equipment interfaces 535, 537 associated with the tools 120, 140; a sensor interface 540 associated with the fabrication tool 140; an application interface 545; machine interfaces 590, 595; an operator interface 560; and a data handler 565. Each of the integration components in this particular embodiment, are software-implemented. They are programmed in C++ using object-oriented programming techniques as are known in the art. An advantage of the APC system 500 is its modular structure, which provides portability of software components.

The plan execution manager 530 is the component primarily responsible for "choreographing" the operation of the APC System 500. The plan execution manager 530 interprets APC plans, executes main scripts and subscripts, and invokes event scripts as events dictate. A variety of plans, scripts, and subscripts may be used in various implementations. The specific number and function of various plans, scripts, and subscripts will be implementation specific. For instance, the present embodiment includes, but is not limited to, the following plans:

a data collection plan—a data structure used by sensor and machine interfaces defining the requirements for what data should be collected from a specific processing equipment, and how that data should be reported back;

=a duration plan—a plan that defines trigger conditions and trigger delays that cause sensors to act, e.g., start data collection, stop data collection;

a reporting plan—a plan that defines what to do with the collected data, as well as when to signal the data's availability; and a sampling plan—a plan that defines the frequency at which the data is to be collected by an external sensor;

a control plan—a collection of control scripts designed to be used together to perform APC activities; and a control script—a sequence of actions/activities that the APC system is to execute under a particular defined situation.

The plan execution manager 530 coordinates the execution of user-defined process control plans among all the integration components for a given fabrication tool, such as the tool 120. When instructed, the plan execution manager 530 retrieves a plan and its associated scripts. It preprocesses subscripts to provide routines to main and event scripts. It also obtains a list of the capabilities necessary to execute the plan, as specified in the plan and connects to the proper integration components providing the required capabilities.

The plan execution manager 530 then delegates responsibility to run the plan to a plan executor 570. In the illustrated embodiment, plan executors 570 are created by the plan execution manager 530 to sequentially execute the plan and report completion of the plan, or errors in the execution of the plan, to the plan execution manager 530. Thus, while the plan execution manager 530 is responsible for the overall management of all plans executed, each plan executor 570 is responsible for running only one plan. The plan executor 570 is created by the plan execution manager 530, exists for the life of the plan, and is destroyed by the plan execution manager 530 after reporting that the plan is completed or aborted. Each plan executor 570 executes a main script and zero or more event scripts. The plan execution manager 530 can start multiple plans concurrently via multiple plan executors.

The machine interfaces 590, 595 bridge the gap between the APC framework, e.g., the APC system manager 525, and the equipment interfaces 535, 537. The machine interfaces 590, 595 interface the fabrication tools 120, 140 with the APC framework and support machine setup, activation, monitoring, and data collection. In this particular embodiment, the machine interfaces 590, 595 primarily translate between specific communications of the equipment interfaces 535, 537 and CORBA communications of the APC framework. More particularly, the machine interfaces 590, 595 receive commands, status events, and collected data from the equipment interfaces 535, 537 and forward as needed to other APC components and event channels. In turn, responses from other APC components are received by the machine interfaces 590, 595 and routed to the equipment interfaces 535, 537. The machine interfaces 590, 595 also reformat and restructure messages and data as necessary. The machine interfaces 590, 595 support the startup/shutdown procedures within the APC System Manager 525. They also serve as APC data collectors, buffering data collected by the equipment interfaces 535, 537 and emitting appropriate data collection events.

The sensor interface 540 collects data generated by the RGA 230 and other sensors monitoring the operation of the fabrication tool 140. The sensor interface 540 provides the appropriate interface environment to communicate with external sensors, such as LabVIEW® or other sensor, bus-based data acquisition software. The application interface 545 provides the appropriate interface environment to execute control plug-in applications such as LabVIEW, Mathematica, ModelWare, MatLab, Simca 4000, and Excel. The sensors may be supplied with the fabrication tool 140 by the original equipment manufacturer ("OEM") or they may be "add-on" sensors installed subsequent to acquisition from the OEM. As noted above, the RGA 230 is an "add-on" sensor. The sensor interface 540 collects data generated by the sensors. The sensors may generate data on, for instance, the pressure, temperature, power, or time for the operating conditions. The application interface 545 takes data from the plan executor 570 and performs calculations or analysis on that data. The results are then returned to the plan executor 570. The machine interface 590 and the sensor interface 540 use a common set of functionality to collect data to be used. The equipment interface 535 gathers the respective data collected by the sensors on the fabrication tool 120 and transmits the gathered data to the machine interface 590.

The operator interface 560 facilitates communication between a wafer fabrication technician and the APC system 500 via a graphical user interface ("GUI") (not shown). The GUI may be a Windows® or UNIX-based operating system. However, this is not necessary to the practice of the invention. Indeed, some alternative embodiments might not even employ a GUI and may communicate through a disk operating system ("DOS") based operating system. The operator interface 560 displays dialogue boxes to provide information, request guidance and collect additional data. Through a CORBA interface, the operator interface 560 component allows technicians to display a variety of popup dialogs simultaneously on any number of display groups. The operator interface 560 also maintains a group of displays in which a popup could appear. The operator interface 560 may also provide an announcement operation, i.e., a one-way message that displays a simple popup with message and "OK" button.

The data handler 565 receives data generated by other APC system 500 components and stores the data in data stores 570, 573 (e.g., relational databases) on the database servers 515, 517. The data handler 565 may be adapted to receive standard structured query language ("SQL") commands, or alternatively, the data handler 565 may translate a different type of access protocol to generate a SQL command or some other protocol command. Centralizing the data storage functions increases the portability of the various components.

With reference to the present invention, the fabrication tools 120, 140 process wafers (not shown) as discussed above relative to FIGS. 1–2. The fabrication tools 120, 140 operate under the control of plans delegated by the Plan Execution Manager 530 to the Plan Executors 570, which then execute the plans. The actual operation of the fabrication tool 120, fabrication tool 140, and the RGA 230 are controlled by the Equipment Interfaces 535, 537 and the Application Interface 545, respectively, through the plan. The RGA 230 samples the desorbed volatiles and outputs the raw spectral data as discussed above. The data handler 565 receives the raw spectral data through the sensor interface 540 and, in this particular embodiment, stores it in one or both of the data stores 570, 573.

The APC System Manager 525 then invokes an Applications Program 580 to analyze the raw spectral data and take appropriate action. The Applications Program 580 implements some particular embodiment of the method 400 in FIG. 4 to analyze the data. Spectroscopic analysis techniques are well known to the art and any suitable technique may be employed. The Applications Program 580 then reports the results to the APC System Manager 525. If there is residual material, the APC System Manager 525 orders the Plan Execution Manager 530 to implement a new plan for the fabrication tool 120 or the fabrication tool 140 with a modified parameter. The Plan Execution Manager 530 formulates a new plan with the modified parameter, transmits it to the Plan Executor 570, and kills the old plan. The Plan Executor 570 then implements the new plan with the modified parameter on the fabrication tool 120.

The particular embodiments disclosed above are illustrative only, as the invention may be modified and practiced in different but equivalent manners apparent to those skilled in the art having the benefit of the teachings herein. For instance, although not discussed above, the raw spectral data can be manipulated in other useful ways, such as in troubleshooting or in trend and variability analysis. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A process for use in fabricating an integrated circuit, comprising:
    performing an operation on a wafer using a fabrication tool;
    generating desorbed volatiles from the wafer after performing the operation;
    sampling the desorbed volatiles;
    generating raw spectral data from the sampled desorbed volatiles, the raw spectral data indicating the content of the desorbed volatiles;
    performing a spectroscopic analysis of the raw spectral data; and
    modifying an operational parameter of the fabrication tool responsive to the result of the results of the spectroscopic analysis.

2. The process of claim 1, wherein performing an operation on a wafer using a fabrication tool includes performing a chemical mechanical polishing operation, a plasma etching operation, or a wafer cleaning operation.

3. The process of claim 2, wherein modifying the operational parameter of the fabrication tool includes increasing a rinse time or increasing a polishing time of the chemical mechanical polishing operation.

4. The process of claim 1, wherein modifying the operational parameter of the fabrication tool includes increasing a rinse time of a chemical mechanical polishing operation, increasing a polishing time of a chemical mechanical polishing operation, resetting a scheduled maintenance time.

5. The process of claim 1, wherein generating desorbed volatiles from the wafer after performing the operation includes heating the wafer in a vacuum chamber to generate desorbed volatiles.

6. The process of claim 5, wherein heating the wafer in a vacuum chamber includes heating the wafer in a lamp degas chamber or a pedestal temperature controlled process chamber.

7. The process of claim 1, wherein sampling the desorbed volatiles includes sampling the desorbed volatiles with a residual gas analyzer.

8. The process of claim 1, wherein modifying the operational parameter includes issuing a new APC plan.

9. The process of claim 1, further comprising at least one of:
    storing the results of the spectroscopic analysis;
    performing a trend analysis on the results of the spectroscopic analysis; and
    performing a variability analysis on the results of the spectroscopic analysis.

* * * * *